(12) United States Patent
Larouche (10) Patent No.: US 8,205,186 B1
(45) Date of Patent: Jun. 19, 2012

(54) INCREMENTAL MODIFICATION OF INSTRUMENTATION LOGIC

(75) Inventor: Mario Larouche, Portland, OR (US)

(73) Assignee: Synopsys, Inc., Mountain View, CA (US)

(*) Notice: Subject to any disclaimer, the term of this patent is extended or adjusted under 35 U.S.C. 154(b) by 181 days.

(21) Appl. No.: 11/400,590

(22) Filed: Apr. 7, 2006

Related U.S. Application Data (60) Provisional application No. 60/670,827, filed on Apr. 11, 2005.

(51) Int. Cl.
*G06F 17/50* (2006.01)

(52) U.S. Cl. ........................................ 716/136; 716/111

(58) Field of Classification Search .................. 716/4–6, 716/100–139
See application file for complete search history.

(56) References Cited

U.S. PATENT DOCUMENTS

| | | | |
|---|---|---|---|
| 5,412,260 A | 5/1995 | Tsui et al. | |
| 5,416,919 A | 5/1995 | Ogino et al. | |
| 5,491,793 A | 2/1996 | Somasundaram et al. | |
| 5,544,311 A | 8/1996 | Harenberg et al. | |
| 5,596,743 A | 1/1997 | Bhat et al. | |
| 5,717,699 A | 2/1998 | Haag et al. | |
| 5,771,240 A | 6/1998 | Tobin et al. | |
| 5,951,696 A | 9/1999 | Naaseh et al. | |
| 6,094,729 A | 7/2000 | Mann | |
| 6,107,821 A | 8/2000 | Kelem et al. | |
| 6,134,707 A | 10/2000 | Herrmann et al. | |
| 6,157,210 A | 12/2000 | Zaveri et al. | |
| 6,182,268 B1 | 1/2001 | McElvain | |
| 6,188,975 B1 | 2/2001 | Gay | |
| 6,202,044 B1 | 3/2001 | Tzori | |
| 6,202,172 B1 | 3/2001 | Ponte | |
| 6,212,650 B1 | 4/2001 | Guccione | |
| 6,240,376 B1 | 5/2001 | Raynaud et al. | |
| 6,247,147 B1 | 6/2001 | Beenstra et al. | |
| 6,255,836 B1 | 7/2001 | Schwarz et al. | |
| 6,255,845 B1 | 7/2001 | Wong et al. | |
| 6,263,373 B1 | 7/2001 | Cromer et al. | |
| 6,286,114 B1 * | 9/2001 | Veenstra et al. | 714/39 |
| 6,292,765 B1 | 9/2001 | Ho et al. | |
| 6,301,688 B1 | 10/2001 | Roy | |
| 6,311,317 B1 | 10/2001 | Khoche et al. | |
| 6,321,329 B1 | 11/2001 | Jaggar et al. | |
| 6,336,087 B2 | 1/2002 | Burgun et al. | |
| 6,363,520 B1 | 3/2002 | Boubezari et al. | |

(Continued)

OTHER PUBLICATIONS

Dutt et al., "Efficient Incremental Rerouting for Fault Reconfiguration in Field Programmable Gate Arrays", Proceedings of the 1999 IEEE/ACM international conference on Computer-aided design, pp. 173-177.*

*Primary Examiner* — Vuthe Siek
*Assistant Examiner* — Aric Lin
(74) *Attorney, Agent, or Firm* — Blakely, Sokoloff, Taylor & Zafman LLP; Judith A. Szepesi (57) ABSTRACT

A method and system for incremental updating of instrumentation logic in integrated circuit designs. During debugging of a circuit design, instrumented signals are modified without rerunning synthesis and place and route. According to an embodiment, instrumentation logic is incrementally changed by the following operations: Building a list of available signals, modifying one or more instrumented signals, connecting or disconnecting the modified signals, and rerouting the modified signals.

15 Claims, 11 Drawing Sheets

U.S. PATENT DOCUMENTS

| | | |
|---|---|---|
| 6,374,370 B1 | 4/2002 | Bockhuas et al. |
| 6,377,911 B1 | 4/2002 | Sample et al. |
| 6,377,912 B1 | 4/2002 | Sample et al. |
| 6,378,093 B1 | 4/2002 | Whetsel |
| 6,389,558 B1 | 5/2002 | Herrmann et al. |
| 6,389,586 B1 | 5/2002 | McElvain |
| 6,425,101 B1 | 7/2002 | Garreau |
| 6,430,727 B1 | 8/2002 | Warren |
| 6,434,735 B1 | 8/2002 | Watkins |
| 6,438,735 B1 | 8/2002 | McElvain et al. |
| 6,449,736 B1 | 9/2002 | Matt et al. |
| 6,449,762 B1 | 9/2002 | McElvain |
| 6,456,101 B2 | 9/2002 | Dumbri |
| 6,460,148 B2 | 10/2002 | Veenstra et al. |
| 6,460,174 B1 | 10/2002 | Carey |
| 6,493,852 B1 | 12/2002 | Narain et al. |
| 6,510,534 B1 | 1/2003 | Nadeau-Dostie et al. |
| 6,567,932 B2 | 5/2003 | Edwards et al. |
| 6,581,191 B1 * | 6/2003 | Schubert et al. .......... 716/4 |
| 6,591,369 B1 | 7/2003 | Edwards et al. |
| 6,594,802 B1 | 7/2003 | Ricchetti et al. |
| 6,907,592 B1 * | 6/2005 | Dante .......... 716/12 |
| 6,931,572 B1 | 8/2005 | Schubert et al. |
| 7,076,751 B1 * | 7/2006 | Nixon et al. .......... 716/5 |
| 2002/0147939 A1 | 10/2002 | Wenzel et al. |
| 2002/0177990 A1 | 11/2002 | Sample |
| 2002/0194543 A1 | 12/2002 | Veenstra et al. |
| 2003/0131325 A1 * | 7/2003 | Schubert et al. .......... 716/4 |
| 2003/0233625 A1 * | 12/2003 | Brazell et al. .......... 716/8 |
| 2005/0151258 A1 * | 7/2005 | Kotecha et al. .......... 257/758 |

* cited by examiner

FIG. 1 (Prior Art)

(Prior Art)

INCREMENTAL MODIFICATION OF INSTRUMENTATION LOGIC

The present application claims priority to U.S. Provisional Patent Application No. 60/670,827 filed on Apr. 11, 2005, and entitled "Method and System for Making Incremental Changes to Instrumentation Logic", which is incorporated herein by reference in its entirety; this application claims the benefit of the provisional application's filing date under 35 U.S.C. §119(e). The present application hereby claims the benefit of this earlier filing date under 35 U.S.C. §120.

BACKGROUND OF THE INVENTION

1. Field of the Invention

The present invention generally relates to computer-aided circuit designs. More specifically, the present invention pertains to methods and systems for designing, instrumenting, and debugging integrated circuits.

2. Description of the Related Art

Integrated circuits are designed by designers to operate in specific ways. Once designed, the circuits may need to be analyzed, diagnosed, and debugged. Debugging is a process which involves detection, diagnosis, and correction of functional failures or discrepancies between the intended design and manifested behavior. In the detection phase, the designer of the circuit observes a functional failure. When the designer is able to gather enough information about the behavior of the integrated circuit, the designer of the circuit can draw the necessary conclusions to diagnose the functional failure. To correct the functional failure, a fix is applied and the design is modified. When the design is provided in a Hardware Description Language (HDL), such a fix may be a textual change to the HDL description of the integrated circuit.

During, or subsequent to, the circuit design, instrumentation circuitry may be added to facilitate the analysis, diagnosis and debugging of the integrated circuit design. Various techniques and systems of design instrumentation at an HDL level are described, for example, in the U.S. Pat. No. 6,931,572, which is incorporated herein by reference in its entirety. An electronic monitoring circuit may be provided within an integrated circuit hardware product for assisting a debugger system in debugging the circuit design within the integrated circuit hardware product. A typical electronic monitoring circuit includes a trigger processing unit for monitoring trigger events and issuing a trigger action based on one or more of the monitored trigger events, probe circuits coupled between the integrated circuit hardware product and the trigger processing unit, a configuration register that stores configuration information for use in configuring the trigger processing unit or the probe circuits, and a communication controller operatively connected to the configuration register to provide external access to the configuration register by the debugger system.

After a circuit is designed, certain signals are selected for instrumentation to facilitate the analysis, diagnosis and debugging of the electronic circuit design. Synthesis and place and route are then run on the design with instrumentation circuitry. This is illustrated in a flow diagram shown in FIG. 1, which we call the "initial flow" in this disclosure. At 102, a circuit design is created and compiled. In some cases, the design is created by writing a text representation of a circuit in Hardware Description Language (HDL). The text representation may be input into a compiler. After compilation, a register transfer level (RTL) netlist may be generated. The RTL netlist usually shows registers and other logic interconnected to show the flow of data through a circuit that was described in the text representation. At 104, one or more signals in the design are selected and instrumented. During instrumentation, a user may select the debugging logic or specify the debugging hardware. Debugging logic is then inserted based on the user's selections. In certain cases, the user may select the number of instrumentation signals and the instrumentation type associated with each signal, such as trigger only, sample only, or trigger and sample. At 106, synthesis and place and route are run on the design. During synthesis, the RTL netlist may be mapped to a target architecture. The mapping operation converts the RTL level representation of the desired circuit into the equivalent circuit implemented using building blocks of the target architecture. A technology specific netlist is generated. Conventional place and route tools may then be used to create a design of circuitry in the target architecture. At 108, the design is debugged. During debugging of the integrated circuit design, the designer may find that one or more signals that should have been instrumented are not or that one or more of the instrumented signals are not necessary. In the prior art methods, the price for adjusting the instrumented signals is high. First, the set of instrumented signals have to be modified. Then, synthesis and place and route have to be rerun on the design. After that, the design may be debugged again. Each time the designer wants to change the set of instrumented signals for a design, this costly process must be repeated.

Figure 1:
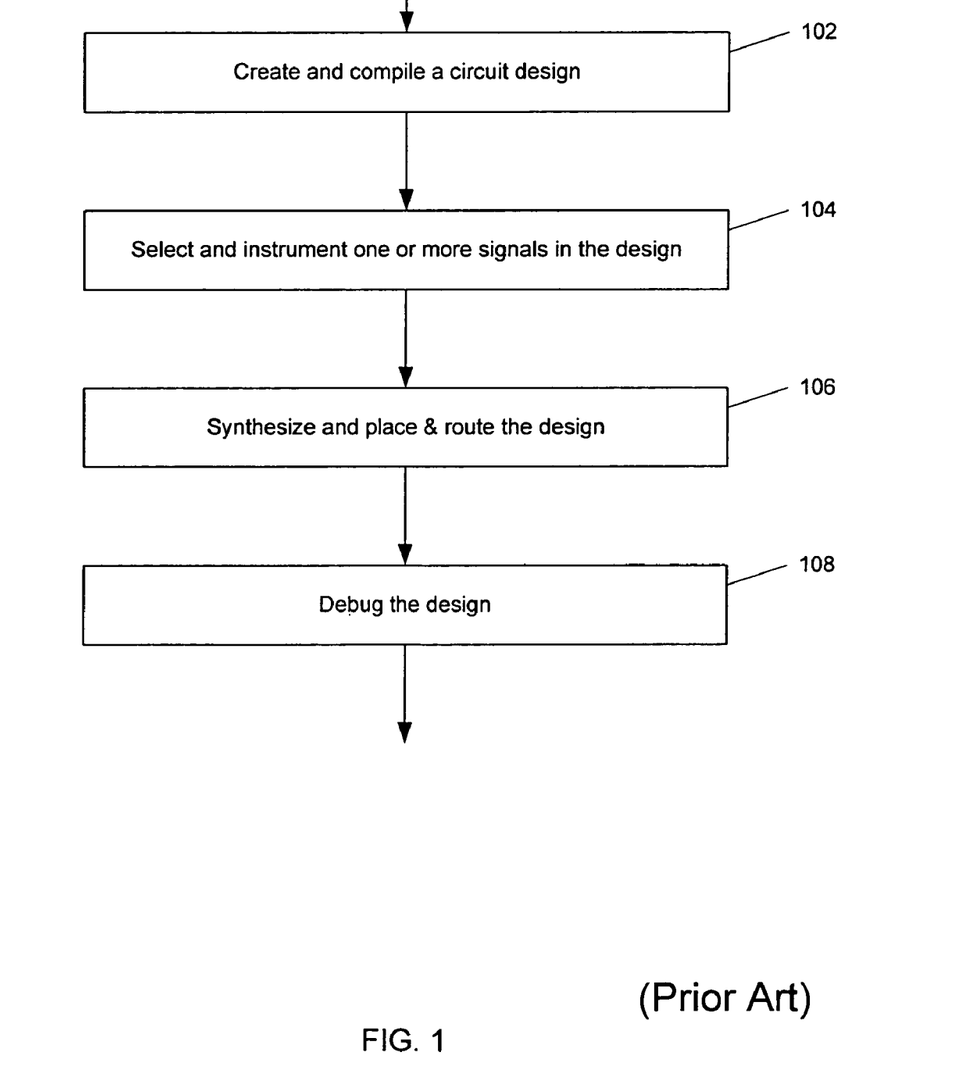
FIG. 1 illustrates a method for creating and debugging an integrated circuit design. The method includes an operation for initially instrumenting the circuit design ("initial flow") to facilitate analysis, diagnosis, and debugging.
Figure 2:
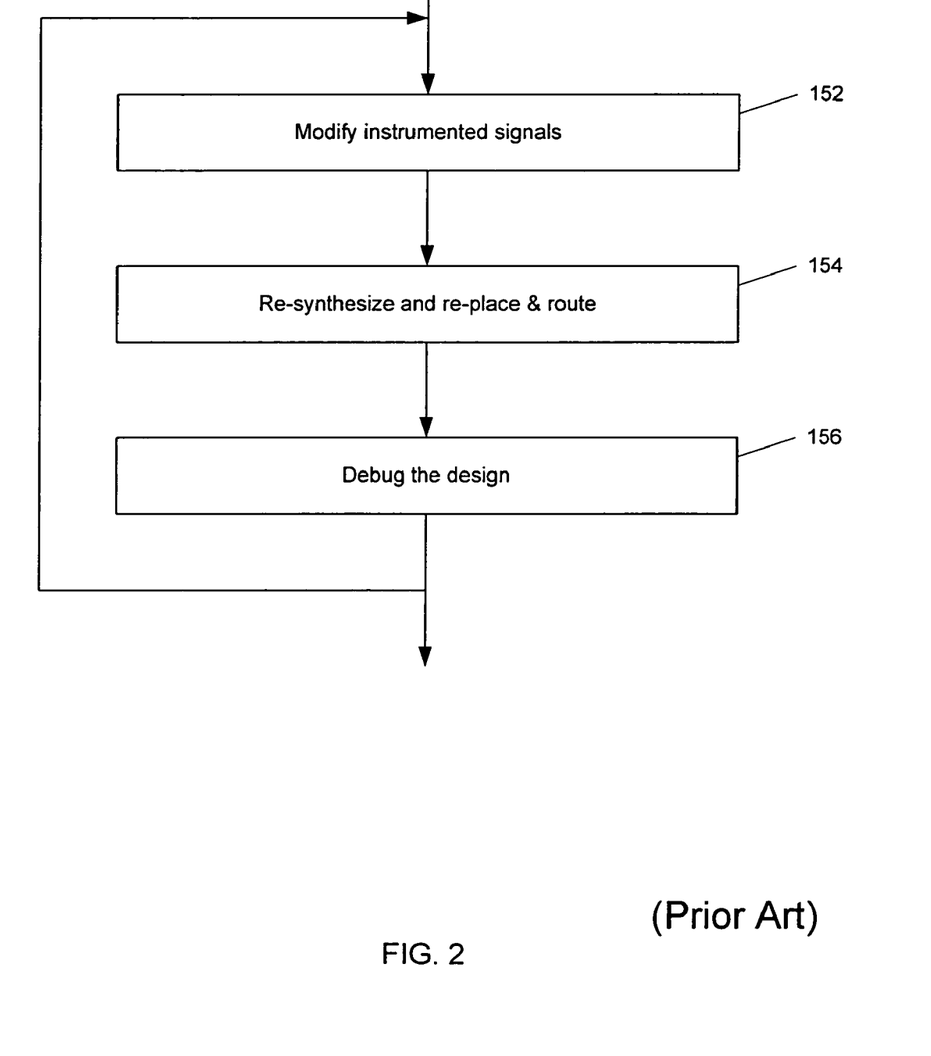
FIG. 2 is a flow diagram illustrating a prior art method for modifying instrumented logic. The method is essentially equivalent to the initial instrumentation process, for example, shown in FIG. 1.

FIG. 2 illustrates a method for modifying the instrumented signals in the prior art. The initial instrumentation logic is built, for example, according to a method shown in FIG. 1 ("initial flow"), and the circuit design is debugged. When the instrumentation logic needs to be changed, one or more instrumented signals are first modified as illustrated in block 152. Next, synthesis and place & route are rerun on the design, at 154. Then, the design may be debugged again, at 156. Whenever the instrumentation logic needs to be modified, these operations, 152, 154, and 156, are repeated, as indicated by a loop in the flow chart. This prior art method is essentially equivalent to the initial instrumentation process, for example as shown in FIG. 1, in that it requires complete rerunning of synthesis and place & route operations, which can be very time-consuming, among other things.

BRIEF SUMMARY OF THE DESCRIPTION

The present invention relates to methods and systems for designing, instrumenting, and debugging electronic circuits. According to an embodiment, a method for making incremental changes to instrumentation logic is provided. After a circuit is initially designed, certain signals are selected for instrumentation. Synthesis and place and route are then run on the design. During debugging of a circuit design, the instrumented signals may need to be modified. In an embodiment of the present invention, this may be done without rerunning synthesis and place and route by incrementally modifying the instrumentation logic.

According to an embodiment of the present invention, a list of signals available for instrumentation is first built and it is presented to a user. The user modifies the instrumented signals, for example, by deselecting one or more existing instrumentation signals and/or adding new signals to be instrumented. The new signals are selected from the presented list of available signals. In certain embodiments, this is interactively and/or iteratively performed through a user interface. Then, the design is updated with the modified instrumented signals, e.g., by connecting and/or disconnecting the modified signals. Subsequently, partial rerouting is performed on the modified design with the updated instrumentation logic.

According to some embodiments of the present invention, a list of available signals is built based on various criteria. For example, the signals that are accessible after the synthesis and place & route of the circuit design (e.g., stored in a place-and-route database) may be made available for incremental modification of instrumentation logic. In some cases, the available signal may need to have the counterpart in its HDL description, e.g., in the RTL source. In certain embodiments, only the signals that can be guaranteed to have the same functions before and after the synthesis and place & route are included in the list of available signals.

In at least one embodiment of the present invention, a method is provided for incrementally updating instrumentation logic for a design of an integrated circuit having one or more signals. During the initial instrumentation, extra circuitry is added for instrumentation which may not be associated with any particular signals in the circuit design. In some embodiments, certain signals are marked so that they can be instrumented later using incremental instrumentation, that is, without rerunning synthesis and place & route on the design. Each of the extra instrumentation circuitry is associated with one of the following instrumentation types: (a) sample-only, (b) trigger-only, and (c) sample-and-trigger. In certain embodiments, the maximum number of each instrumentation type is fixed. During any subsequent modification of the instrumentation logic, the user may be presented with various information, for example, regarding the number of signals that can be additionally selected for each instrumentation type.

Once the instrumentation logic is modified, rerouting is performed on the updated design with the modified instrumented signals. According to an embodiment of the present invention, one or more regions, blocks, nets, etc, are first determined which are affected by the change in the instrumentation logic. Then, the routing is performed in those affected regions only. In some cases, the routing may be performed on the whole circuit subsequent to, or concurrent with, the partial routing on the affected regions.

Therefore, as summarized herein, the present invention provides, among other things, methods and systems for incrementally updating instrumentation logic in circuit designs without rerunning synthesis and place and route. According to an embodiment, instrumentation logic is incrementally changed by the following operations: Building a list of available signals, modifying the instrumentation logic, and rerouting the modified design. These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The present invention will now be described more fully hereinafter with reference to the accompanying drawings, in which various exemplary embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Likewise, for purposes of explanation, numerous specific details are set forth in the following description in order to provide a thorough understanding of the present invention. It will be evident, however, to one skilled in the art that the present invention may be practiced without these specific details. In other instances, well-known circuits, structures, devices, and techniques are not shown in detail in order not to obscure the understanding of the description of the present invention.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiment.

The present invention provides methods and systems for incrementally updating the instrumentation logic in integrated circuit designs. During debugging of a circuit design, instrumented signals are modified without rerunning synthesis and place and route. According to an embodiment, instrumentation logic is incrementally changed by the following operations: Building a list of available signals, modifying or deleting one or more instrumented signals and/or adding additional signals for instrumentation, connecting or disconnecting the new and/or modified/deleted signals, and rerouting the design with modified signals.

Figure 3:
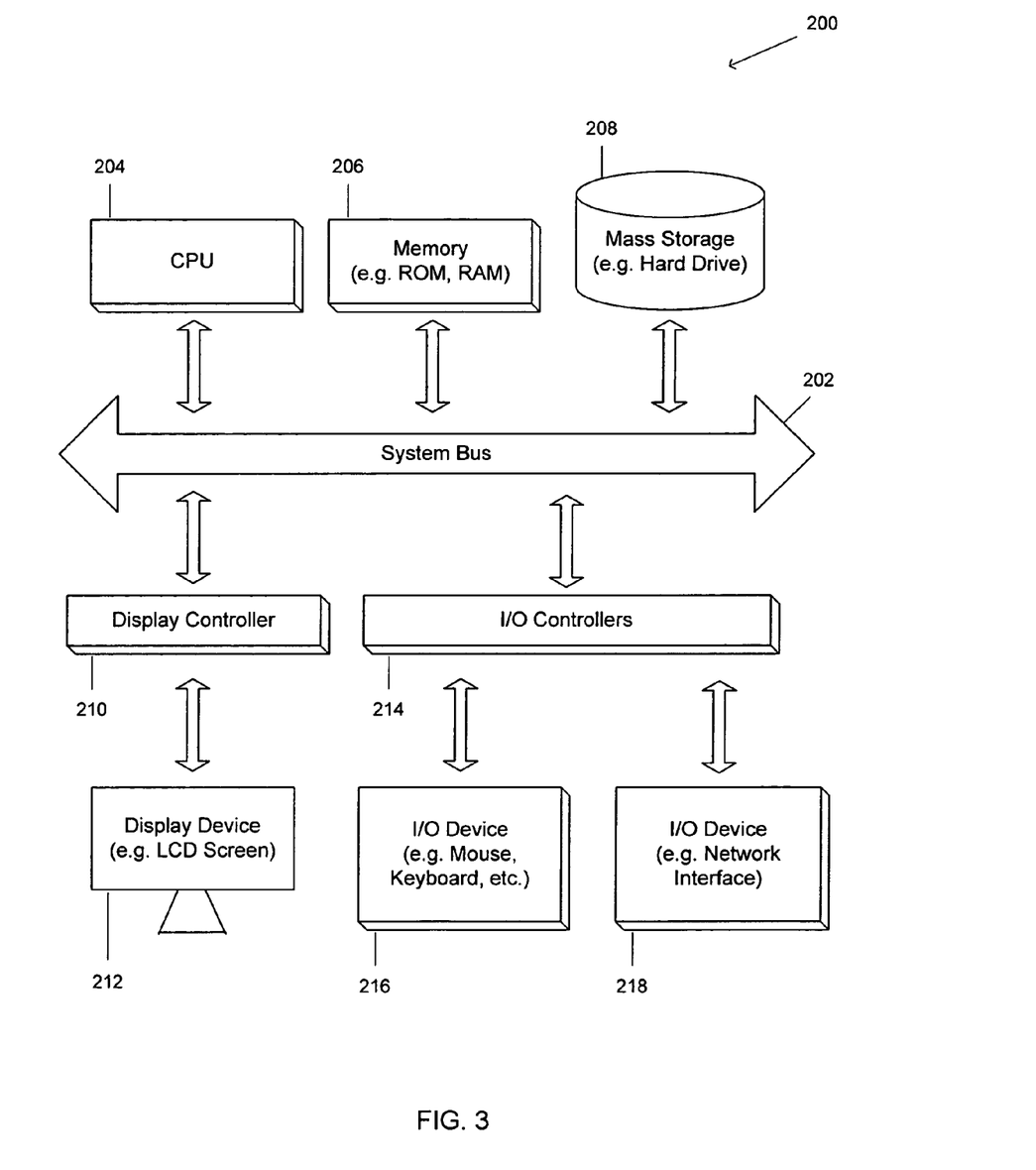
FIG. 3 is a block diagram illustrating a suitable computing environment in which certain aspects of the illustrated invention may be practiced.

Referring now to FIG. 3, a block diagram illustrates a suitable computing environment in which certain aspects of the illustrated invention may be practiced. This exemplary system 200 can be used with various embodiments of the present invention. As will be appreciated by one of skill in the art, however, the present invention may be embodied as a method, data processing system or program product as well as an article of manufacture or an apparatus. Thus the scope of the invention should be determined by the appended claims and their legal equivalents, and not by the examples given. Note that while the block diagram of FIG. 3 illustrates various components of a data processing system, it is not intended to represent any particular architecture or manner of interconnecting the components. It is to be appreciated that various components of the exemplary data processing system may be rearranged, and that certain implementations of the present invention may not require nor include all of the above components. It will also be appreciated that personal computers, laptops, and network computers, and other data processing systems such as cellular telephones, personal digital assistants, music players, etc. which have fewer components or perhaps more components may also be used with the present invention. The data processing system of FIG. 3 may, for example, be a specialized computer system for use in computer-aided circuit design.

As shown in FIG. 3, the exemplary data processing system 200 includes a bus 202 which is coupled to a microprocessor(s) 204 and a memory 206 such as a ROM (read only memory) or a volatile RAM and a non-volatile storage device(s) 208. The system bus 202 interconnects these various components together and also interconnects these components 204, 206, and 208 to a display controller(s) 210 and display devices 212 such as LCD screens and to peripheral devices such as input/output (I/O) devices 216 and 218 which may be mice, keypads, input wheels, modems, network interfaces, printers and other devices which are well known in the art. Typically, the I/O devices 216 and 218 are coupled to the system through I/O controllers 214. The volatile RAM (random access memory) 206 is typically implemented as dynamic RAM (DRAM) which requires power continually in order to refresh or maintain the data in the memory. The mass storage 208 is typically a magnetic hard drive or a magnetic optical drive or an optical drive or a DVD ROM or other types of memory systems which maintain data (e.g. large amounts of data) even after power is removed from the system. Typically, the mass storage 208 will also be a random access memory although this is not required. While FIG. 3 shows that the mass storage 208 is a local device coupled directly to the rest of the components in the data processing system, it will be appreciated that the present invention may utilize a non-volatile memory which is remote from the system, such as a network storage device which is coupled to the data processing system through a network interface 218 such as a modem or Ethernet interface. The bus 202 may include one or more buses connected to each other through various bridges, controllers and/or adapters as is well known in the art. In one embodiment, the I/O controller 214 includes a USB (universal serial bus) adapter for controlling USB peripherals and an IEEE 1394 (i.e., "firewire") controller for IEEE 1394 compliant peripherals. The display controllers 210 may include additional processors such as GPUs (graphical processing units) and they may control one or more display devices 212.

As will be appreciated by those skilled in the art, the content for implementing an embodiment of the method of the invention, for example, computer program instructions, may be provided by any machine-readable media which can store data that is accessible by the system 200 shown in FIG. 3, as part of or in addition to memory, including but not limited to cartridges, magnetic cassettes, flash memory cards, digital video disks, random access memories (RAMs), read-only memories (ROMs), and the like. In this regard, the exemplary data processing system is equipped to communicate with such machine-readable media in a manner well-known in the art.

It will be further appreciated by those skilled in the art that the content for implementing an embodiment of the method of the invention may be provided to the system 200 from any external device capable of storing the content and communicating the content to the system 200. For example, in one embodiment of the invention, the system 200 may be connected to a network, and the content may be stored on any device in the network.

The present invention relates to methods and systems for designing, instrumenting, and debugging integrated circuits. In particular, at least one embodiment of the present invention provides a method for making incremental changes to the instrumentation logic of the integrated circuits. During the initial circuit design, certain signals are selected for instrumentation. Synthesis and place and route are then run on the design ("initial flow"). In the subsequent debugging operations of a circuit design, the instrumented signals may be incrementally modified without rerunning synthesis and place and route. This will be broadly termed "incremental flow" in this disclosure.

Figure 4:
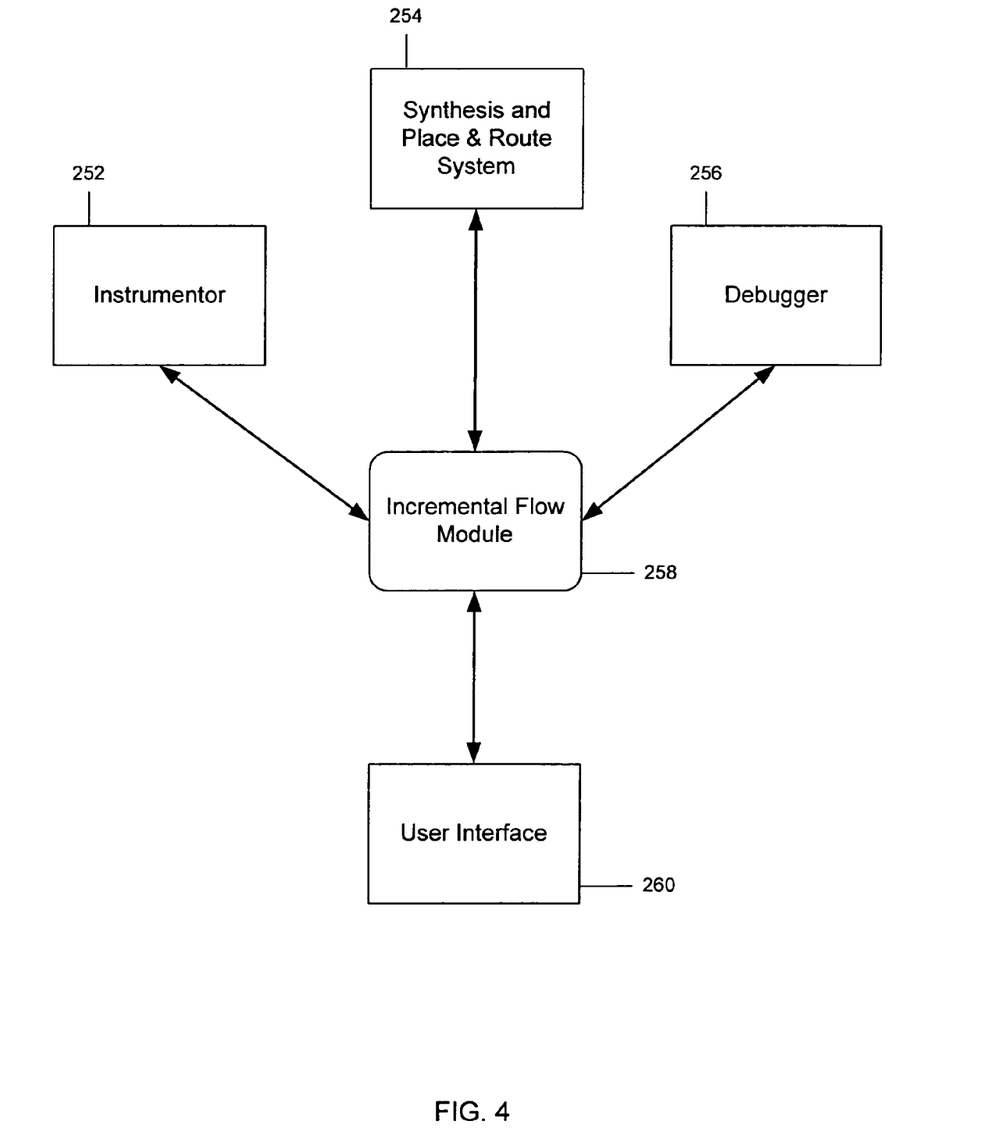
FIG. 4 shows a functional block diagram illustrating an exemplary instrumentation system according to an embodiment of the present invention.

FIG. 4 shows a functional block diagram illustrating an exemplary instrumentation system according to at least one embodiment of the present invention. The diagram shown in the figure is not meant to represent any concrete implementation, and it is presented here for illustrative purposes only. This exemplary block diagram of FIG. 4 includes an instrumentor unit 252, which may be used, among other things, to add instrumentation circuitry to an integrated circuit design. In certain embodiments, the instrumented signals may be stored in a database for later use. The block diagram also includes the synthesis and place & route system 254 and a software or hardware debugger 256. Some of the functions related to incremental modification of the circuit design are included in a unit 258. Some embodiments of the present invention also comprise a user interface 260. The user interface may be used, for example, to allow the user to interactively modify the instrumentation logic.

Figure 5:
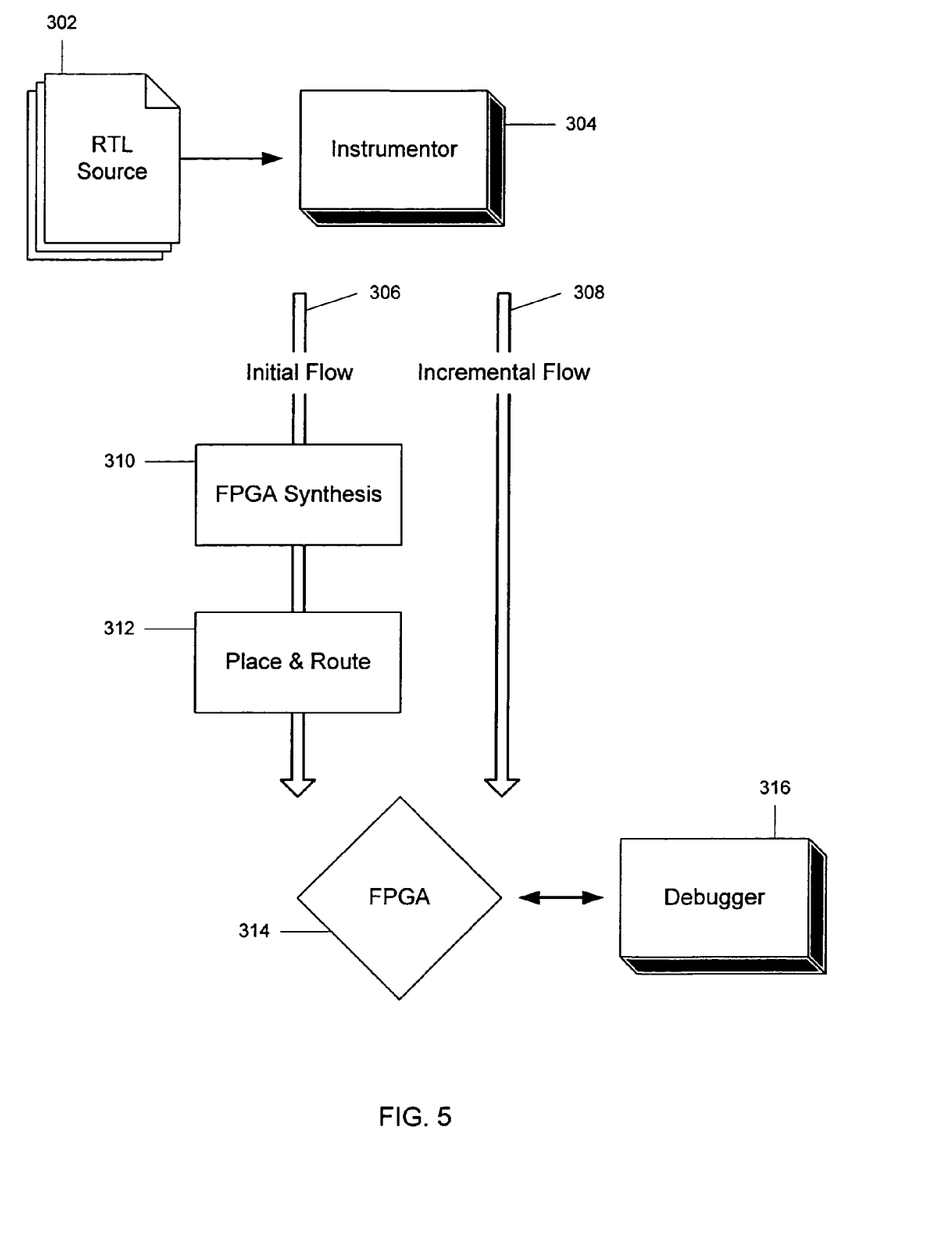
FIG. 5 shows a design flow according to an embodiment of the present invention. The exemplary process is illustrated in the context of designing and debugging an FPGA circuit. The diagram shows the "initial flow" as well as the "incremental flow" for incrementally modifying the instrumentation logic.

FIG. 5 illustrates a design flow according to some embodiments of the present invention. The flow describes an exemplary process for designing and debugging an integrated circuit, in particular, an FPGA circuit in this example. In some embodiments, the circuit design is created by writing a text representation of a circuit in Hardware Description Language (HDL). The text representation may then be compiled and a register transfer level (RTL) netlist may be generated. The RTL netlist, 302 in the figure, usually shows registers and other logic interconnected to show the flow of data through the circuit that was described in the text representation. Then, one or more signals in the design are selected and instrumented using instrumentor 304. During instrumentation, a user may select the debugging logic or specify the debugging hardware. Debugging logic is then inserted based on the user's selections. In certain embodiments, the user may select the number of instrumentation signals and the kind of instrumentation signal, such as trigger only, sample only, or trigger and sample. Then, synthesis 310 and place and route 312 are run on the instrumented design. During synthesis 310, the RTL netlist may be mapped to a target architecture. The mapping operation converts the RTL level representation of the desired circuit into the equivalent circuit implemented using building blocks of the target architecture. A technology specific netlist is generated. Place-and-routing 312 then creates a design of circuitry in the target architecture, as indicated by a block 314 in FIG. 5. The synthesized and place-and-routed circuit design 314 with the initial instrumentation logic may be debugged using a debugger 316. This process is indicated by an arrow 306 with a label "initial flow" in the figure. During debugging of the integrated circuit design, the designer may find that one or more signals that should have been instrumented were not or that one or more of the instrumented signals were not necessary. As illustrated earlier with respect to the flow chart of FIG. 2, this can be done by repeating the initial flow 306 each time instrumentation logic is modified. This is a costly process, among other things. At least one embodiment of the present invention provides a method for incrementally modifying the instrumentation logic without rerunning synthesis and place and route, which is schematically represented by an arrow 308 with a label "incremental flow".

Figure 6:
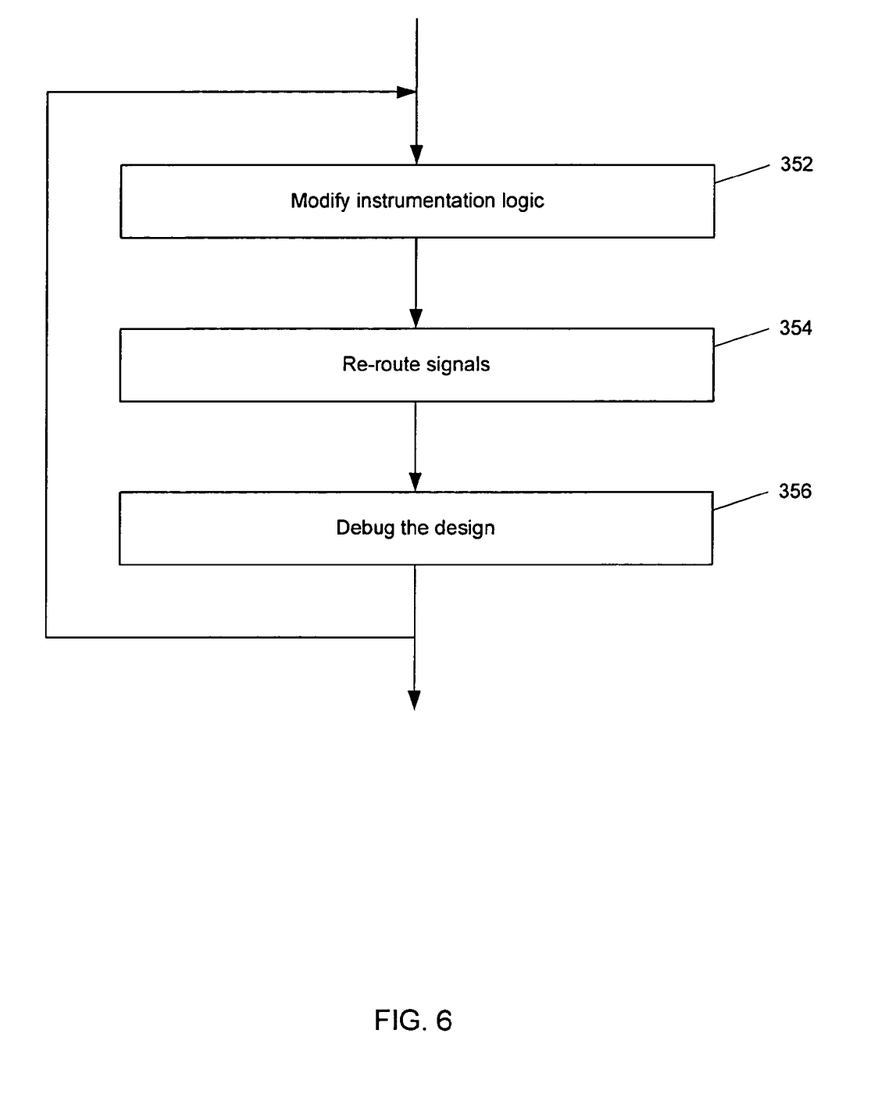
FIG. 6 is a flow diagram illustrating a method according to an embodiment of the present invention.

FIG. 6 is a flow chart illustrating an incremental flow according to an embodiment of the present invention. This exemplary process may be viewed in connection with, or subsequent to, an initial flow, for example, as illustrated in FIG. 1. In particular, a circuit design has been created with an initial instrumentation logic in this example. The initial instrumentation logic is modified, at block 352, for example, based on an input from a user (e.g., a circuit designer). According to an embodiment of the present invention, new synthesis and place & route operations on the updated circuit design is avoided, and instead only rerouting is performed on the modified instrumented signals, at 354. Then the design with modified instrumentation logic is debugged, at 356. This set of operations can be repeated each time the instrumentation logic needs to be modified without incurring the overhead of complete synthesis and place & route.

Figure 7:
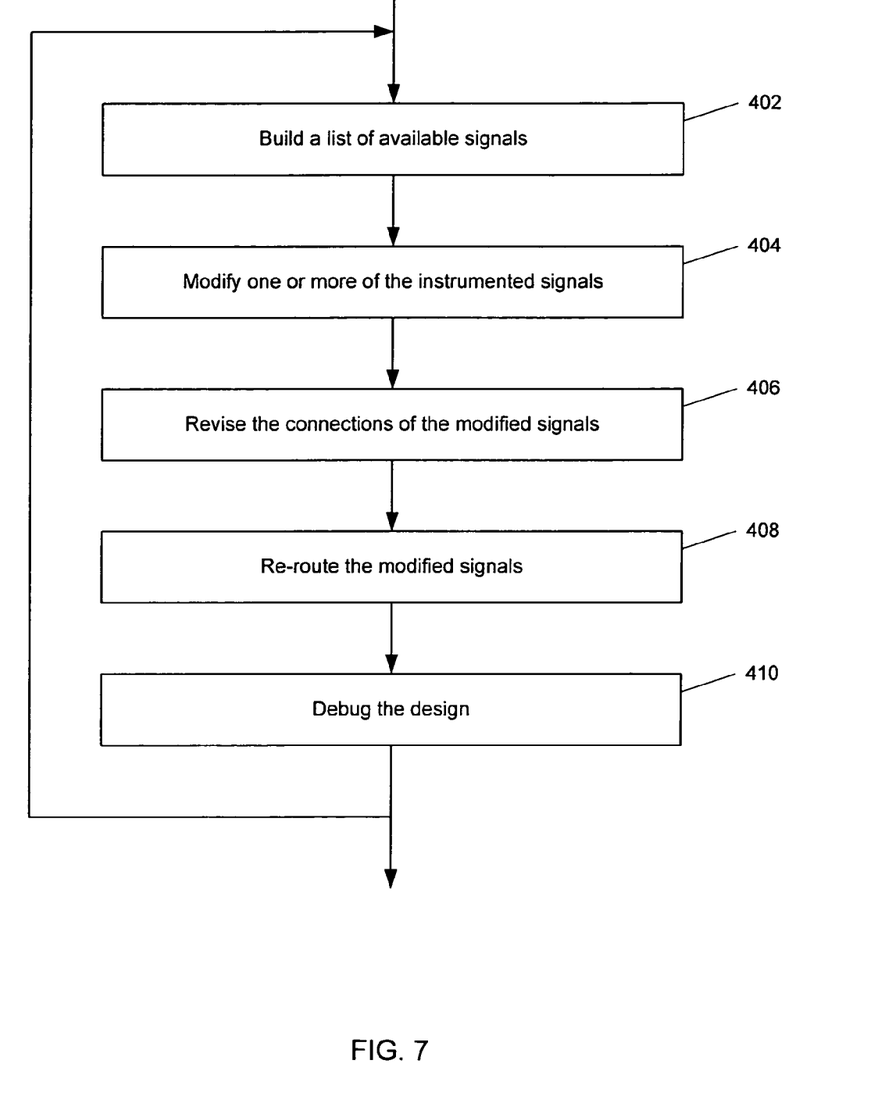
FIG. 7 is a flow diagram illustrating another method according to an embodiment of the present invention.

FIG. 7 illustrates in further detail an exemplary method of incremental flow according to an embodiment of the present invention. At 402, a list of available signals is built. In one embodiment, the signals in the circuit design are analyzed to determine which signals are available for the user to select for instrumentation or deselect from instrumentation. For example, criteria such as whether the signal can be correlated to a signal in the HDL and whether the signal represents the same function in the netlist as in the HDL may be used to determine whether a signal will be available for user selection. In one embodiment, name matching may be used to match names of signals used in the HDL with names of nets in the netlist. In one embodiment, pattern matching may be used to match signals in the HDL with nets in the netlist. An analysis may then be done on the matched names to determine if they represent the same signal function. A list of available signals may then be displayed, where each signal corresponds to a signal in the HDL and represents the same function in the netlist as in the HDL.

At 404, one or more of the instrumented signals are modified. From the list of available signals, the user may then select the signals that he/she wants to modify and specify the type of instrumentation that he/she wants to be added, such as sample and trigger, trigger only, or sample only. In one embodiment, the selection of signals is done from the HDL. In one embodiment, a mark or highlighting may be added to a signal that has been selected for modification. In one embodiment, the number of signals that are instrumented may not exceed the number of signals initially instrumented for each kind of instrumentation, since the hardware created during the first instrumentation has not been changed. Therefore, for each additional signal that is selected for instrumentation, a signal that was initially instrumented must be deselected. A limit for each kind of instrumentation may be calculated and displayed, and an error message may be displayed when a user exceeds any of the limits. In one embodiment, extra instrumentation logic may be added to the design initially, for example, in operation 104 of FIG. 1, to provide extra instrumentation signals that may be connected without disconnecting initially instrumented signals. For example, a user may select three signals to be instrumented initially: one sample and trigger, one sample only, and one trigger only. Instead of providing instrumentation logic for three instrumented signals, instrumentation logic may be provided for six signals: two sample and trigger, two sample only, and two trigger only. In this way, when the user decides to add a signal for instrumentation after debug, there is extra instrumentation logic in place to do so without having to disconnect an initially instrumented signal.

At block 406 of FIG. 7, the connections of the modified signals are revised. For example, a previously instrumented signal that no longer needs to be instrumented is disconnected or a newly instrumented signal is connected. In one embodiment, these connection modifications are done using an editing tool that allows certain nets to be disconnected and other nets to be connected instead. The modified signals are then rerouted, at 408. In one embodiment, the rerouting is done on the modified nets and takes into account the congestion created by the rest of the design. In some instances, the rerouting may not be successful. In one embodiment, one or more registers in the instrumentation logic may be moved to increase the chance of success when connecting the modified nets. In one embodiment, one or more registers are reprogrammed with different inputs and/or outputs. In one embodiment, extra space is created in the initial design to allow room for rerouting of signals after debug. After the modified signals have been successfully rerouted, the circuit design may then be debugged again, as illustrated in block 410. This method may be repeated each time the user wants to modify the instrumented signals.

Figure 8:
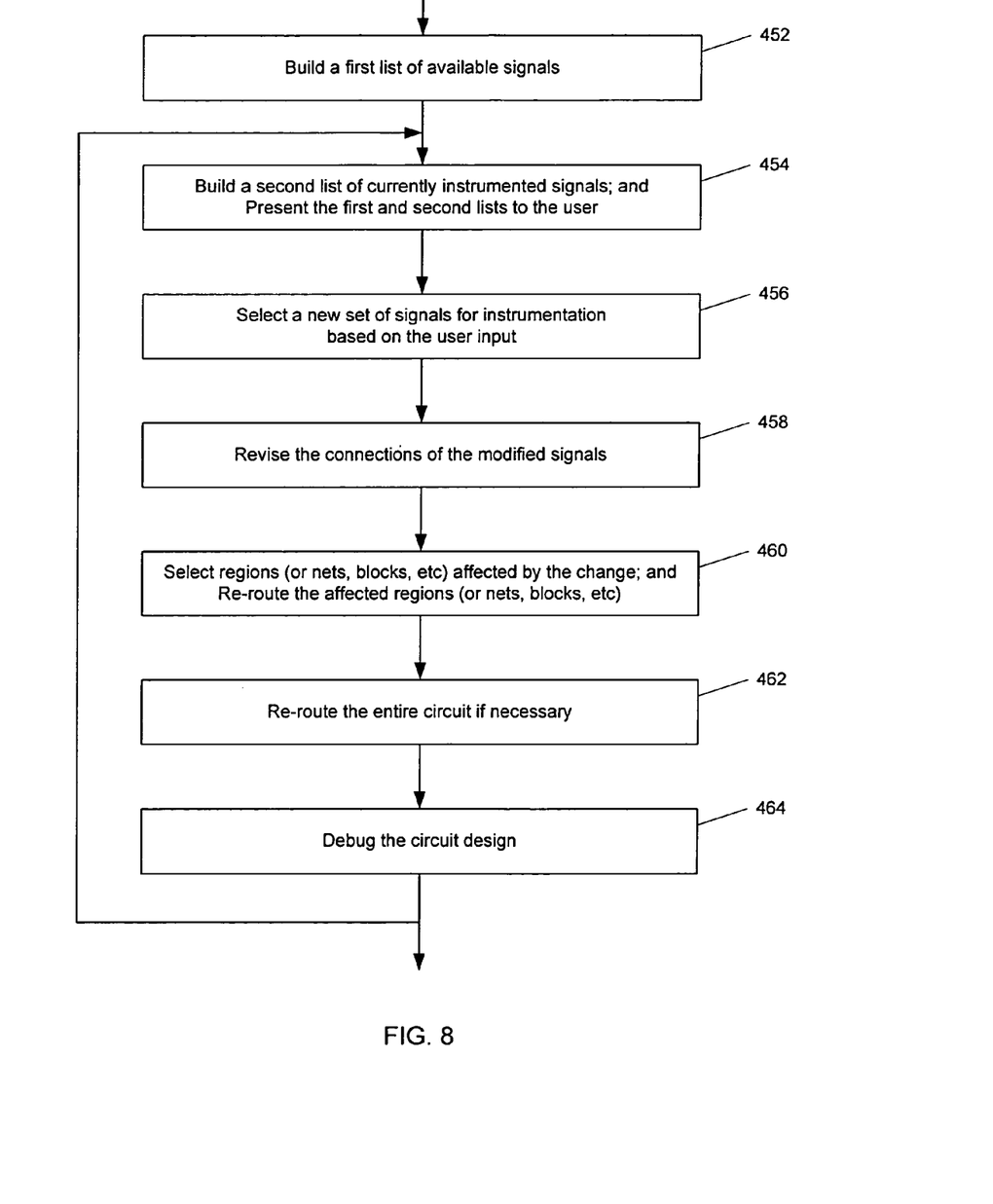
FIG. 8 is a flow diagram illustrating yet another method according to an embodiment of the present invention.

FIG. 8 illustrates another exemplary method according to at least one embodiment of the present invention. A list of available signals is first built, at 452, as in the exemplary process of FIG. 7. According to an embodiment of the present invention, a list of available signals is built based on various criteria. For example, the signals that are accessible after the synthesis and place & route of the circuit design (e.g., signals in the netlist) may be made available for incremental modification of instrumentation logic. In some cases, the available signal may need to have the counterpart in its HDL description, e.g., in the RTL source. In one embodiment, name matching may be used to match names of signals used in the HDL with names of nets in the netlist. In one embodiment, pattern matching may be used to match signals in the HDL with nets in the netlist. An analysis may then be done on the matched names to determine if they represent the same signal function. In certain embodiments, only the signals that can be guaranteed to have the same functions before and after the synthesis and place & route are included in the list of available signals. At block 454, a list of currently instrumented signals is created. Then the list of available signals and the list of currently instrumented signals are displayed to the user along with any additional information such as the number of available signal "slots" for each instrumentation type. In some embodiments, the two lists may be presented as a single table including all available signals with appropriate attributes, for example, indicating whether a certain signal is currently instrumented or not.

From the presented information including the lists of available signals and currently instrumented signals, the user may then deselect the instrumented signals that no longer need to be instrumented and/or select the signals that need to be added or modified, as illustrated in block 456 of FIG. 8. The user can further specify the type of instrumentation associated with each signal to be instrumented, such as sample and trigger, trigger only, or sample only. The connections of the modified signals are then revised, at block 458, based on the updated instrumentation logic. For example, a previously instrumented signal that no longer needs to be instrumented is disconnected or a newly instrumented signal is connected. In one embodiment, these connection modifications are done using an editing tool that allows certain nets to be disconnected and other nets to be connected instead.

Once the instrumentation logic is modified, rerouting is performed on the updated design with the modified instrumented signals, at 460 and 462 of FIG. 8. According to an embodiment of the present invention, first one or more regions, blocks, nets, etc, are determined which are affected by the change in the instrumentation logic, at 460. Then, the routing is performed in those affected regions only. In certain embodiments, the routing may be performed optionally on the whole circuit, at 462, subsequent to, or concurrent with, the partial routing on the affected regions. In cases the rerouting is not successful, one or more registers in the instrumentation logic may be moved to increase the chance of success when connecting the modified nets, or one or more registers may be reprogrammed with different inputs and/or outputs. In one embodiment, extra space is created in the initial design to allow room for rerouting of signals during a subsequent incremental flow process.

After the modified signals have been rerouted, the circuit design with an updated set of instrumented signals may then be debugged again, as illustrated in block 464. This process may be repeated each time the user wants to modify the instrumentation logic, as indicated by a loop in the flow chart of FIG. 8.

Figure 9:
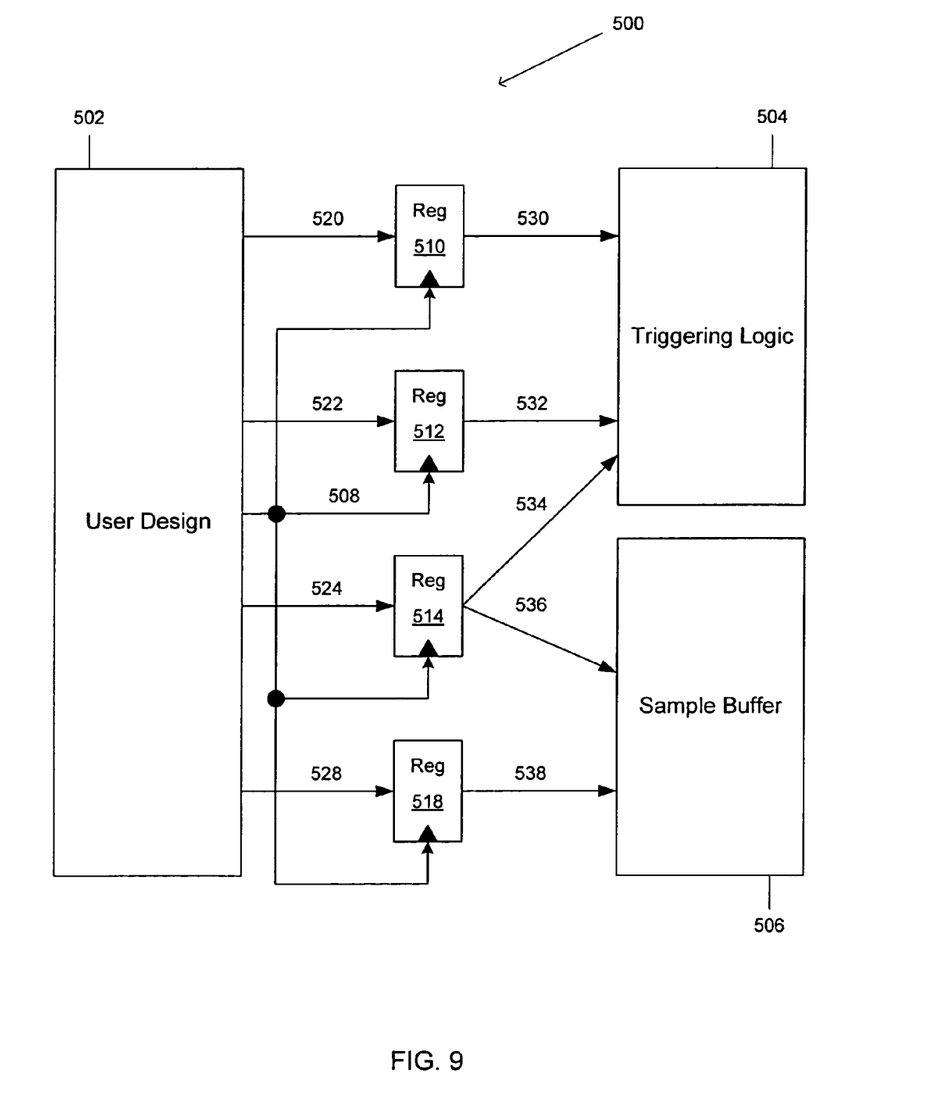
FIG. 9 is a block diagram illustrating an exemplary system according to an embodiment of the present invention. The figure shows that four signals from the user design are currently selected for instrumentation.

Turning now to FIG. 9, a block diagram is depicted illustrating an exemplary system 500 according to an embodiment of the present invention. A user design 502 may have been initially implemented, for example, according to a method of "initial flow" described earlier with respect to FIG. 1 or FIG. 5. The user design 502 may have been further modified, for example, according to the methods described earlier with respect to FIGS. 6-8. In this example design, four signals 520, 522, 524, and 528 are currently selected by the user for instrumentation: two trigger only signals 530 and 532, one sample only signal 528, and one trigger and sample signal 524. The signals 520, 522, 524, and 528 are input into registers 510, 512, 514, and 518, respectively. The outputs 530, 532, 534, 536, and 538 from the registers are input into triggering logic 504 or sample buffer 506 accordingly.

In some embodiments of the present invention, incremental changes may be made to the instrumentation logic according to the methods described in connection with FIGS. 6-8. A user may make signal selections from the HDL. A list of signals available for selection (not explicitly shown in the figure other than the instrumented signals) may be displayed for the user, as described earlier. The user may select one or more of the instrumented signals 520, 522, 524, and 528 to be modified. The clock signal 508 is not available for modification. If the user deselects one of the instrumented signals, that signal will be disconnected from the corresponding register. A new signal may then be selected for instrumentation and connected to the available register. For example, the user may decide that signal 520 is not needed for instrumentation and he or she may deselect signal 520, which makes register 510 available for other signals. If the user decides that another signal (from a list of available signals) needs to be instrumented, the new signal is selected for instrumentation and it may be connected to the available register 510. This new signal would be instrumented as trigger only since signal 520 was initially instrumented as trigger only. The signal 520 would be disconnected from the input of register 510 and the newly instrumented signal would be connected to the input of register 510. In some embodiments, additional instrumentation circuitry, which may not be associated with any particular signals, may be added during the initial instrumentation process. For example, register 510 may have been available without signal 520 being connected to its input in the initial design. This will be further elaborated later with respect to FIG. 11. Once the instrumented signals are modified, rerouting would then be done for the circuit design with the modified signals. If the rerouting is successful, the user may then proceed to debug the design. The process of making incremental changes to the instrumentation logic may be repeated each time the user wants to modify one or more of the instrumented signals without rerunning synthesis and place and route.

Figure 10:
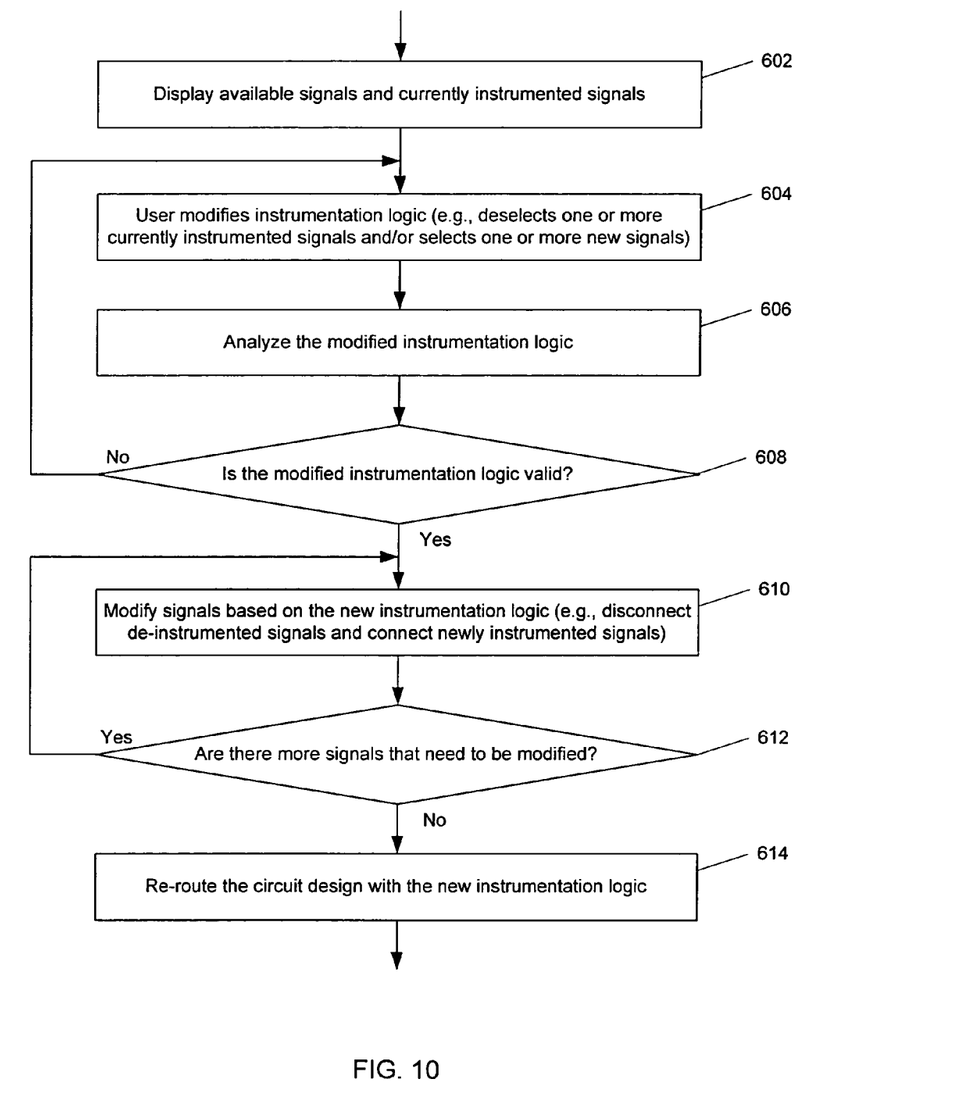
FIG. 10 illustrates an exemplary method for incrementally modifying instrumentation logic according to an embodiment of the present invention.

With reference to FIG. 10, an exemplary method is illustrated for incrementally modifying instrumentation logic according to an embodiment of the present invention. The exemplary method starts by displaying available signals to a user, at 602, where each signal may correspond to a signal in the HDL and represent the same function in the netlist as in the HDL. Currently instrumented signals and their instrumentation types are also displayed. Then, the user modifies one or more of the instrumented signals, at 604. From the list of available signals, the user may select the signals to be instrumented and specify the type of instrumentation. When the user is done with modifying instrumentation logic, it is analyzed at 606. For example, the number of signals that are to be instrumented may not exceed the number of signals initially instrumented for each type of instrumentation, as explained earlier. As certain instrumented signals are deselected, new signals may be added for instrumentation with the same instrumentation type. A limit for each kind of instrumentation may be calculated and displayed, for example, at 602. If the user updated instrumentation logic cannot be implemented for any reason, for example, because it exceeds any of the limits in the instrumentation types, then the user may be directed to try again, following the No branch at block 608. In some embodiments, an error or warning message may be displayed, possibly with additional information, e.g., as to how to fix the problem. If the new instrumentation logic is considered valid, then the connections of the modified signals are revised, at 610. For example, previously instrumented signals that no longer need to be instrumented are disconnected and newly instrumented signals are connected, as illustrated in connection with FIG. 9. This operation is repeated, as indicated by a loop including 610 and 612 in the flow chart of FIG. 10, until the instrumentation circuitry is completely revised reflecting the change in the instrumentation logic. Once the revision is completed, the modified signals are then rerouted, at 614. This exemplary method of incremental flow may be repeated each time the user wants to modify the instrumented logic without incurring the overhead of synthesis and trace and route.

As described earlier, extra instrumentation logic may be added to the integrated circuit design during the initial design phase so that extra instrumentation signals may be connected later without disconnecting the initially instrumented signals. For example, a user may select three signals to be instrumented initially: one sample and trigger, one sample only, and one trigger only. Instead of providing instrumentation logic for three instrumented signals, instrumentation logic may be provided for six signals: two sample and trigger, two sample only, and two trigger only. In this particular scenario, only the three signals are explicitly associated with the instrumentation logic, while three more signals may be instrumented later without having to disconnect any of the three initially instrumented signals. In some embodiments, certain signals are marked so that they can be instrumented later using incremental instrumentation, that is, without rerunning synthesis and place & route on the design. During the initial synthesis and place & route (e.g., initial flow of FIG. 5), certain signals, which are not instrumented, may be removed, replaced, or otherwise modified (e.g., for optimization), and they may not be available for instrumentation during the incremental flow. In certain embodiments, this can be prevented by using special markers during the initial instrumentation phase.

Figure 11:
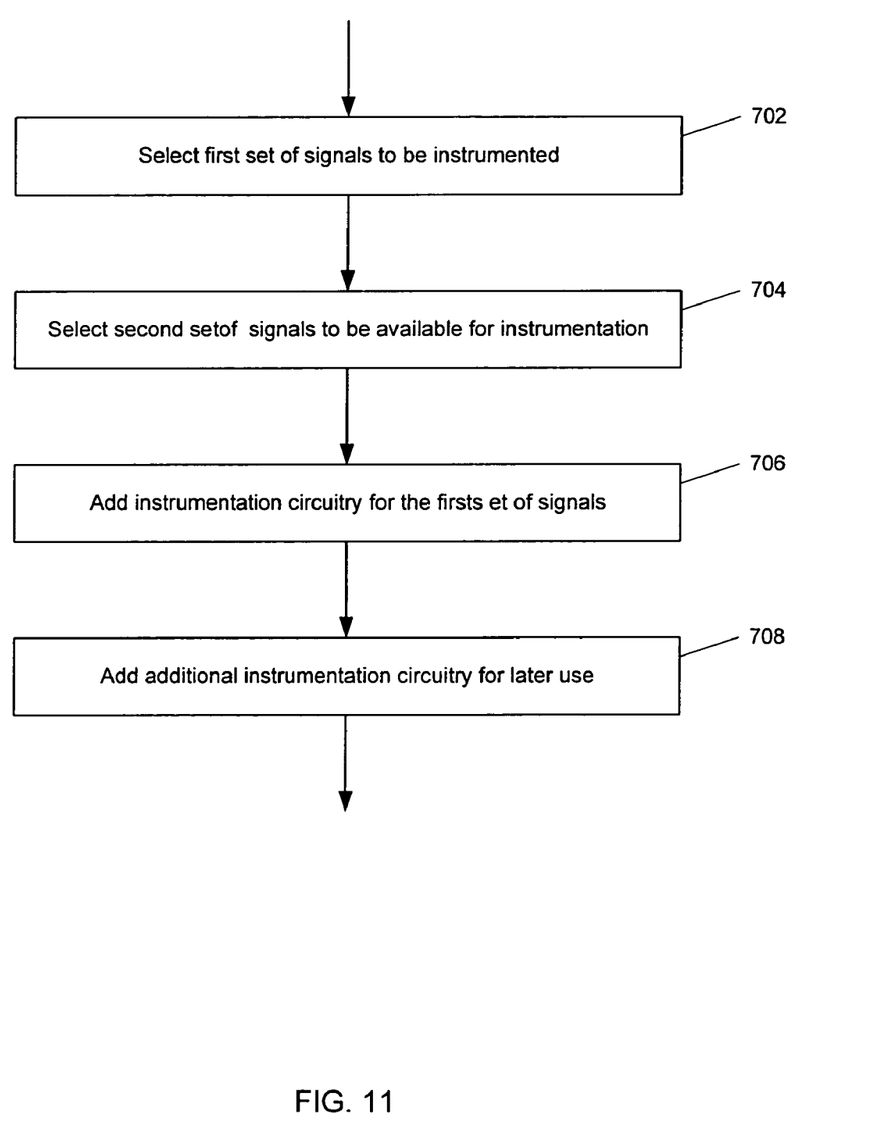
FIG. 11 is a flow chart illustrating a method for setting up initial instrumentation logic for an integrated circuit according to an embodiment of the present invention.

FIG. 11 shows a flow chart illustrating an exemplary method for instrumenting an integrated circuit according to an embodiment of the present invention. In this example, a first set of signals is first selected for instrumentation, at 702. In addition, a second set of signals is selected, at 704, which, while not necessary to be instrumented initially, may need to be instrumented later. These signals may be specially marked so that they will be guaranteed to be available in the netlist, for example. Then, instrumentation circuitry is, added and connected to the signals in the first set, at 706. In certain embodiments, additional instrumentation circuitry may be added, at 708, so that they may be connected to any additional signals that need to be instrumented later.

Thus, methods, systems, and apparatuses for incrementally modifying instrumentation logic in circuit designs have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense

What is claimed is:

1. A method comprising:
   synthesizing, placing, and routing a netlist to create an integrated circuit design in a target architecture;
   selecting at least one first signal from a set of available signals by determining signals in the netlist that correlate to a signal in a hardware description language (HDL) and that represents an identical function in the netlist as in the HDL for instrumentation;
   selecting at least one second signal from the set of available signals for instrumentation, wherein the at least one second signal is marked as reserved for instrumentation at a later time;
   adding at least one first extra circuit element to the integrated circuit design in the target architecture for instrumentation for said at least one first signal, wherein said at least one first extra circuit element is utilized in instrumenting said at least one first signal; and
   adding at least one second extra circuit element to the integrated circuit design in the target architecture for instrumentation, wherein said at least one second extra circuit element is different from said at least one first extra circuit element,
   wherein said at least one second extra circuit element is not utilized in instrumenting any signal, and marked to prevent from being optimized away,
   wherein said at least one second extra circuit element is designed to be connected to the at least one second signal other than the first signal, wherein the at least one second extra circuit element is instrumented concurrently with the at least one first extra circuit element, and
   wherein the selecting and adding are performed on a representation of the circuit design in the target architecture, the representation being stored in a memory of a data processing system which includes a processor which performs the selecting and adding.

2. The method of claim 1, wherein:
   each circuit element from said at least one second extra circuit element is associated with an instrumentation type, instrumentation type comprising one of the following: (a) sample-only, (b) trigger-only, or (c) sample-and-trigger.

3. The method of claim 1, wherein:
   design of the integrated circuit is written in HDL.

4. The method of claim 1, further comprising:
   selecting another signal to be used for instrumentation from the plurality of signals;
   instrumenting said another signal; and
   re-routing the design in the target architecture utilizing said second at least one second extra circuit element.

5. The method of claim 1, wherein:
   said at least one second extra circuit element comprises at least one of the following: (a) sample-only, (b) trigger-only, and (c) sample-and-trigger.

6. A data processing system, the data processing system configured to design an integrated circuit, the integrated circuit having a plurality of signals, wherein the plurality of signals can be used for instrumentation, the data processing system comprising:
   means for selecting at least one first signal of the integrated circuit design in the target architecture for instrumentation from a plurality of signals, wherein each of the plurality of signals exist in the netlist and correlate to a corresponding signal in the HDL;
   means for selecting at least one second signal from the set of available signals for instrumentation, wherein the at least one second signal is marked as reserved for instrumentation at a later time;
   means for adding at least one first extra circuit element to the integrated circuit design in the target architecture for instrumentation for said at least one first signal, wherein said at least one first extra circuit element is utilized in instrumenting said at least one first signal; and
   means for adding at least one second extra circuit element to the integrated circuit design in the target architecture for instrumentation, wherein said at least one second extra circuit element is different from said at least one first extra circuit element,
   wherein said at least one second extra circuit element is not utilized in instrumenting any signal, and marked to prevent from being optimized away, and
   wherein said at least one second extra circuit element is designed to be connected to the at least one second signal other than the first signal, wherein the at least one second extra circuit element is instrumented concurrently with the at least one first extra circuit element.

7. The data processing system of claim 6, wherein:
   each circuit element from said at least one second extra circuit element is associated with an instrumentation type, instrumentation type comprising one of the following: (a) sample-only, (b) trigger-only, or (c) sample-and-trigger.

8. The data processing system of claim 6, wherein:
   design of the integrated circuit is written in HDL.

9. The data processing system of claim 6, further comprising:

means for selecting another signal to be used for instrumentation from the plurality of signals;
means for instrumenting said another signal; and
means for re-routing the design in the target architecture utilizing said second at least one second extra circuit element.

10. The data processing system of claim 6, wherein said at least one second extra circuit element comprises at least one of the following: (a) sample-only, (b) trigger-only, and (c) sample-and-trigger.

11. A non-transitory machine readable medium containing executable computer program instructions which, when executed by a digital processing system, cause said system to perform a method comprising:
identifying a plurality of signals which exist in a netlist and have a corresponding signal in a hardware description language (HDL) representing the same function in the netlist and the HDL;
selecting at least one first signal for instrumentation from the plurality of signals;
selecting at least one second signal from the set of available signals for instrumentation, wherein the at least one second signal is marked as reserved for instrumentation at a later time;
adding at least one first extra circuit element to the integrated circuit design in the target architecture for instrumentation for said at least one first signal, wherein said at least one first extra circuit element is utilized in instrumenting said at least one first signal; and
adding at least one second extra circuit element to the integrated circuit design in the target architecture for instrumentation, wherein said at least one second extra circuit element is different from said at least one first extra circuit element,
wherein said at least one second extra circuit element is not utilized in instrumenting any signal, and marked to prevent from being optimized away, and
wherein said at least one second extra circuit element is designed to be connected to the at least one second signal other than the first signal, wherein the at least one second extra circuit element is instrumented concurrently with the at least one first extra circuit element.

12. The machine readable medium of claim 11, wherein:
each circuit element from said at least one second extra circuit element is associated with an instrumentation type, instrumentation type comprising one of the following: (a) sample-only, (b) trigger-only, or (c) sample-and-trigger.

13. The non-transitory machine readable medium of claim 11, wherein design of the integrated circuit is written in HDL.

14. The non-transitory machine readable medium of claim 11, further comprising instructions which when executed by the digital processing system cause the system to perform operations comprising
selecting another signal to be used for instrumentation from the plurality of signals;
instrumenting said another signal; and
re-routing the design in the target architecture utilizing said second at least one second extra circuit element.

15. The non-transitory machine readable medium of claim 11, wherein said at least one second extra circuit element comprises at least one of the following: (a) sample-only, (b) trigger-only, and (c) sample-and-trigger.

* * * * *